United States Patent [19]

Hashimoto et al.

[11] Patent Number: 5,406,232
[45] Date of Patent: Apr. 11, 1995

[54] SEMICONDUCTOR CAPACITOR ELEMENT AND A CIRCUIT EMPLOYING THE SAME

[75] Inventors: Yasuhiro Hashimoto; Motofumi Tokuriki, both of Kawasaki, Japan

[73] Assignee: Fujitsu Limited, Kawasaki, Japan

[21] Appl. No.: 98,026

[22] Filed: Jul. 28, 1993

[30] Foreign Application Priority Data

Dec. 10, 1992 [JP] Japan .................. 4-330360

[51] Int. Cl.⁶ .............. H03B 5/24; H03K 3/284; H03K 3/355; H01L 25/00
[52] U.S. Cl. ............. 331/113 R; 331/108 C; 257/296; 327/227; 327/565
[58] Field of Search .......... 331/105, 108 R, 113 R, 331/114, 116 R, 116 FE, 117 R, 117 FE, 117 D, 108 C, 144, 145, 158, 175, 176, 177 R, 177 V; 257/296, 310; 307/273, 303.2

[56] References Cited

U.S. PATENT DOCUMENTS

| | | | |
|---|---|---|---|
| 4,482,820 | 11/1984 | Kohsiek | 331/105 X |
| 4,878,151 | 10/1989 | Gallichio | 361/329 |
| 5,124,669 | 6/1992 | Palmer et al. | 331/113 R X |

*Primary Examiner*—David Mis
*Attorney, Agent, or Firm*—Staas & Halsey

[57] ABSTRACT

A composite semiconductor capacitor element, applicable to various kinds of circuits to reduce the influence of parasitic capacitance therein, includes two semiconductor capacitor elements connected in parallel by connecting terminals which have parasitic capacitances to terminals which do not have parasitic capacitances. Alternatively, two such semiconductor capacitor elements are connected in series by connecting terminals which have parasitic capacitances to each other. Hence, parasitic capacitances at the respective terminals are equal to each other. In addition, as compared with a conventional structure wherein a greater number of parasitic capacitances are connected to one terminal than to the other terminal, the parasitic capacitances are smaller at each terminal side.

20 Claims, 10 Drawing Sheets

SEMICONDUCTOR CAPACITOR ELEMENT AND A CIRCUIT EMPLOYING THE SAME

BACKGROUND OF THE INVENTION

1. Field of the Invention

The present invention relates to a semiconductor capacitor element, and more particularly, to such a semiconductor capacitor element in which in addition to a regular capacitance, which is formed between a pair of terminals of the semiconductor capacitor element, the parasitic capacitance at one terminal of said terminals is reduced.

2. Description of the Related Art

In the field of semiconductor integrated circuits, recent years have seen a problem associated with parasitic capacitance in a semiconductor capacitor element which is used in a semiconductor integrated circuit; that is, the semiconductor integrated circuit malfunctions because of a deterioration of the waveform, frequency characteristics, etc. Hence, there is a demand for a semiconductor capacitor element which has a reduced parasitic capacitance.

SUMMARY OF THE INVENTION

Therefore, an object of the present invention is to offer a semiconductor capacitor element which has a less parasitic capacitance when applied to any kind of circuit.

To solve the problems above, a semiconductor capacitor element according to the present invention is formed by two semiconductor capacitor elements which are connected in parallel to each other by connecting terminals which have parasitic capacitances to terminals which do not have parasitic capacitances. Alternatively, to form the semiconductor capacitor element, two semiconductor capacitor elements are connected in series to each other by connecting terminals having parasitic capacitances to each other.

Further, according to the present invention, a plurality of the parallel-or series-connected semiconductor capacitor element pairs may be formed and connected to each other in series or in parallel to thereby form a pair of semiconductor capacitor elements. In addition, the pair of semiconductor capacitor elements may be formed by combining parallel-connected semiconductor capacitor elements and series-connected semiconductor capacitor elements.

The semiconductor capacitor element constructed as above, when applied to a circuit in which an adverse influence is easily created by parasitic capacitances, produces excellent effects. In particular, when the semiconductor capacitor element according to the present invention is applied to a circuit which has a capacitance which is connected to emitters of a pair of transistors which are differentially connected to each other, for example, an oscillator, a mono-stable multivibrator and etc., excellent effects are produced.

In the parallel-connected semiconductor capacitor elements as above, parasitic capacitances are connected separately from each other to both terminals. Moreover, in the series-connected semiconductor capacitor elements as above, parasitic capacitances are connected to intermediate points of the capacitances. Hence, the parasitic capacitances formed at the respective terminal sides are equal to each other. In addition, as compared with a conventional structure wherein a greater number of parasitic capacitances are connected to one terminal than to the other terminal, each of the parasitic capacitances is small at the respective terminal sides.

The semiconductor capacitor element of the present invention described above, when applied to a circuit in which adverse influences are created by parasitic capacitances, reduces the adverse influence of the parasitic capacitances.

In particular, when the semiconductor capacitor element according to the present invention is applied to a circuit which has a capacitance which is connected to emitters of a pair of transistors which are differentially connected each other, small parasitic capacitances evenly act upon the both transistors of the transistor pair. Hence, it is possible to operate the transistors within their driving abilities and at the same speeds.

Further, when such a circuit utilizes a semiconductor capacitor element which is formed by series-connected semiconductor capacitor elements and which has parasitic capacitances at intermediate points, the influence of the parasitic capacitances becomes zero.

By using a plurality of such semiconductor capacitor elements as above and combining parallel-connected semiconductor capacitor elements and series-connected semiconductor capacitor elements, it is possible to adjust the capacitances of regular and parasitic capacitances at both a design stage and a fabrication stage in a simple manner.

BRIEF DESCRIPTION OF THE DRAWINGS

The above object and features of the present invention will be more apparent from the following description for the preferred embodiment with reference to the accompanying drawings, wherein.

DESCRIPTION OF THE PREFERRED EMBODIMENTS

Before describing the embodiments of the present invention, the related art and the disadvantages therein will be described with reference to the related figures.

Here, to understand the parasitic capacitance which is formed in a semiconductor capacitor element, a MOS capacitor and a junction capacitor will be described with reference to drawings.

Figure 13:
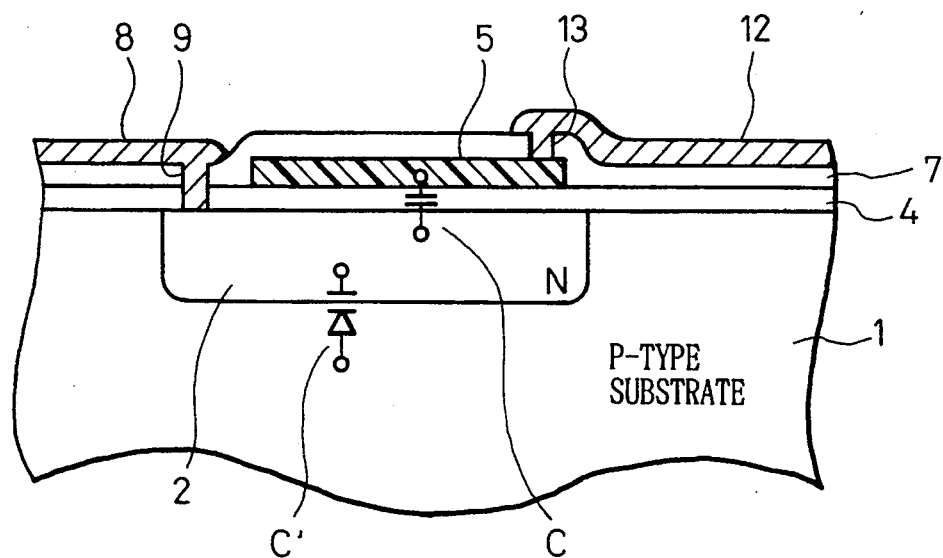
FIG. 13 is a cross sectional view of a conventional MOS capacitance.
Figure 14:
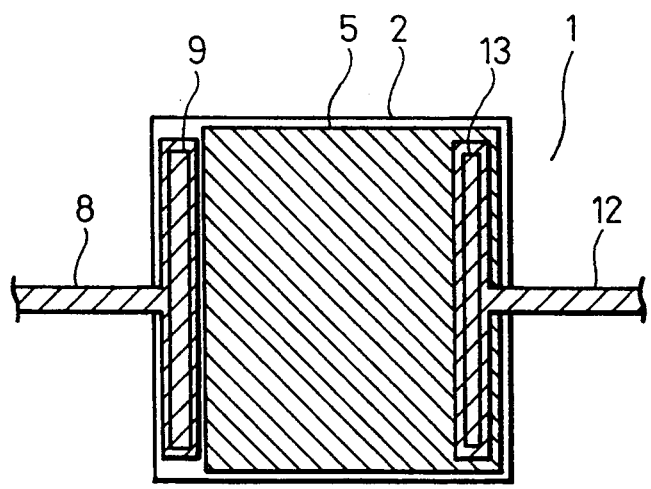
FIG. 14 is a plan view of the layout of FIG. 13.

FIG. 13 shows a cross section of a MOS capacitor. FIG. 14 is a plan view showing the layout of the MOS capacitor with the dielectric film and the insulating film omitted. In the drawings, reference 1 is a P-type substrate, reference 2 is an N-type film (i.e., region) which is formed in the P-type substrate 1, reference 4 is a dielectric film such as an oxide film and a nitride film formed on a surface of the P-type substrate 1, reference 5 is a polysilicon film which is formed on the dielectric film 4 in an opposed relation with the N-type film 2, reference 7 is an insulating film which is formed by an oxide film covering both the dielectric film 4 and the polysilicon film 5, reference 8 is aluminum wiring which is connected with the N-type film 2 through a contact hole 9 which is formed in the dielectric film 4 and the insulating film 7, and reference 12 is aluminum wiring which is connected to the polysilicon film 5 through a contact hole 13 which is formed in the insulating film 7.

In the MOS capacitor, a regular capacitance C is formed between the N-type film 2 and the polysilicon film 5 which are disposed with the dielectric film 4 interposed therebetween. At the same time, in this MOS capacitor, a parasitic capacitance C' is formed at a junction surface at which the P-type substrate 1 and the N-type film 2 abut each other.

Figure 15:
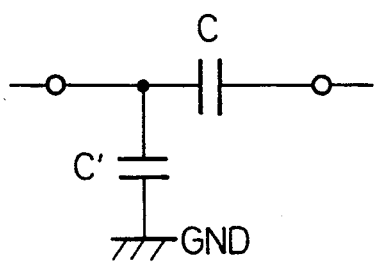
FIG. 15 is a circuit diagram of an the equivalent circuit of the semiconductor capacitor element shown in FIG. 13.

As shown in an equivalent circuit of FIG. 15, the parasitic capacitance C' is formed only at one terminal of the pair of terminals to which the regular capacitance C is connected.

Figure 16:
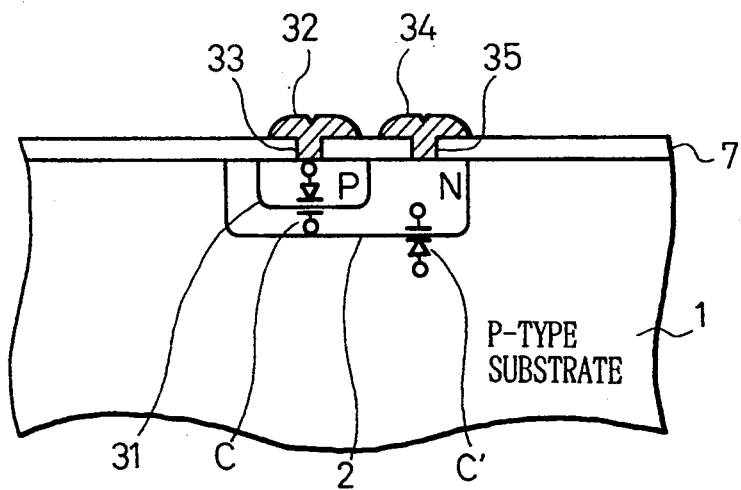
FIG. 16 is a cross sectional view of a conventional junction capacitance.

FIG. 16 is a cross section of a junction capacitor. In FIG. 16, reference 1 is a P-type substrate, reference 2 is an N-type film which is formed in the P-type substrate 1, reference 31 is a P-type film which is formed in the N-type film 2, reference 7 is an insulating film which is formed by an oxide film covering the P-type substrate 1, reference 32 is aluminum wiring which is connected to the P-type film 31 through a contact hole 33 which is formed in the insulating film 7, and reference 34 is aluminum wiring which is connected to the P-type film 2 through a contact hole 35 which is formed in the insulating film 7.

In this junction capacitor, a regular capacitance C is formed at a junction surface between the N-type film 2 and the P-type film 31 while a parasitic capacitance C' is formed at a junction surface at which the P-type substrate 1 and the N-type film 2 abut each other. An equivalent circuit of the junction capacitor is the same as the equivalent circuit shown in FIG. 15, and therefore, the parasitic capacitance C' is formed only at one terminal of the pair of terminals to which the regular capacitance C is connected.

In forming a circuit which has conventional parasitic capacitance as above, elimination of the influence of the parasitic capacitance improves the driving ability of the transistor. However, in some circuits, it is impossible, to improve the driving ability of the transistor. Deterioration in the frequency characteristics due to the influence of the parasitic capacitance cannot always be ignored.

Figure 17:
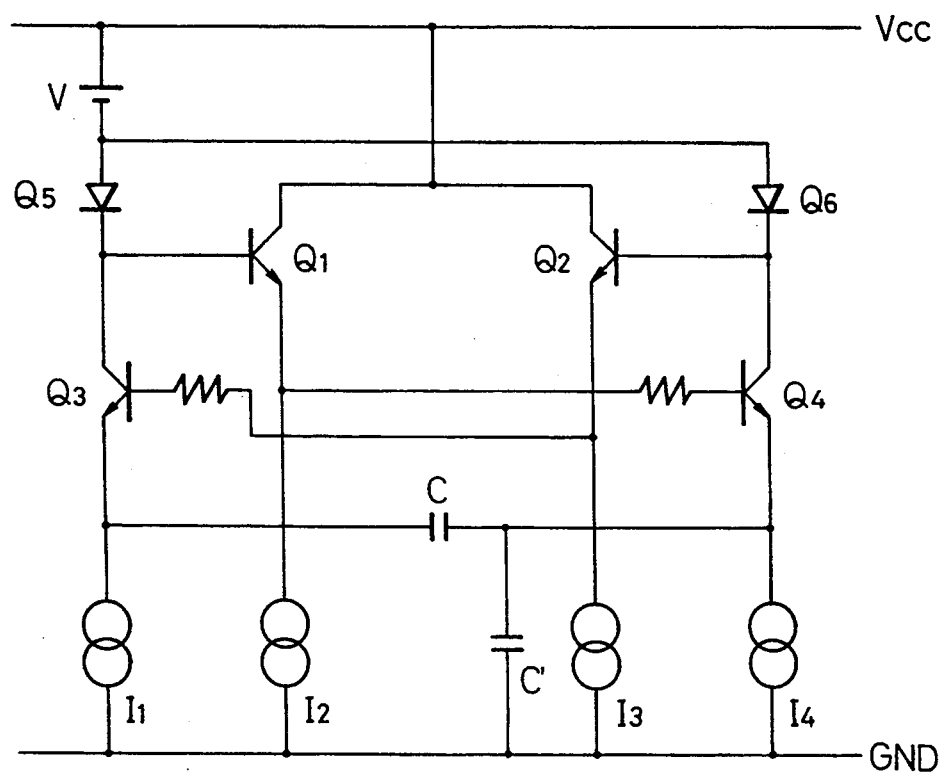
FIG. 17 is a circuit diagram of an oscillator which employs the conventional semiconductor capacitor element.

With reference to FIG. 17, a description will be given of a case where a semiconductor capacitance element having a conventional parasitic capacitance, as above, is used in a voltage controlled oscillator and the parasitic capacitance creates a problem.

In FIG. 17, the references Q1, Q2, Q3 and Q4 denote transistors, the references Q5 and Q6 denote diodes, the reference V denotes a source of voltage, the references I1, I2, I3 and I4 denote sources of current, the reference Vcc denotes a power supply, and the reference GND denotes a reference level (ground). A capacitance is connected between emitters of the transistors Q3 and Q4.

When the capacitance is formed in the circuit with a conventional parasitic capacitance C' formed as illustrated, the parasitic capacitance C' acts only on the side toward the emitter of the transistor Q4. Because of this, when the oscillator starts, there arise inconveniences such as insufficient driving ability of the transistor Q4 and a slower response of the transistor Q4 compared with the speed of the transistor Q3.

Thus, the oscillator as above has problems such as an increase in power consumption and an unstable oscillation.

In the following, an embodiment of the present invention will be described with reference to the drawings. With reference to the drawings, like reference numerals will be used throughout to designate like elements having like functions.

Figure 1:
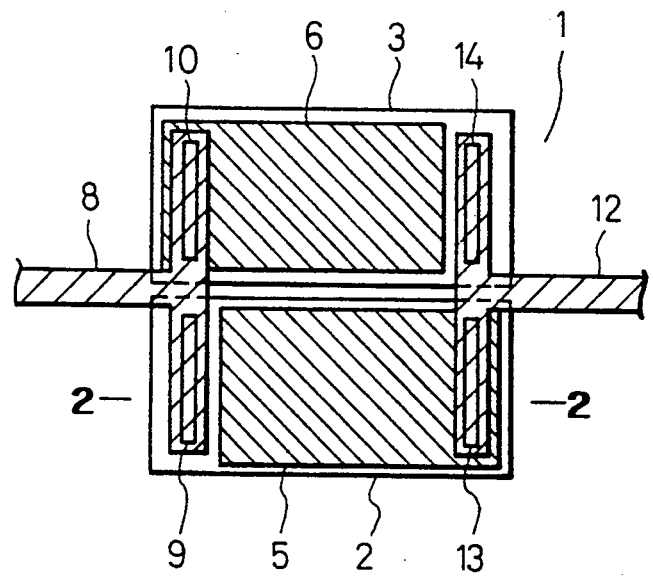
FIG. 1 is a plan view showing the layout of the semiconductor capacitor element of the first embodiment of the present invention.
Figure 2:
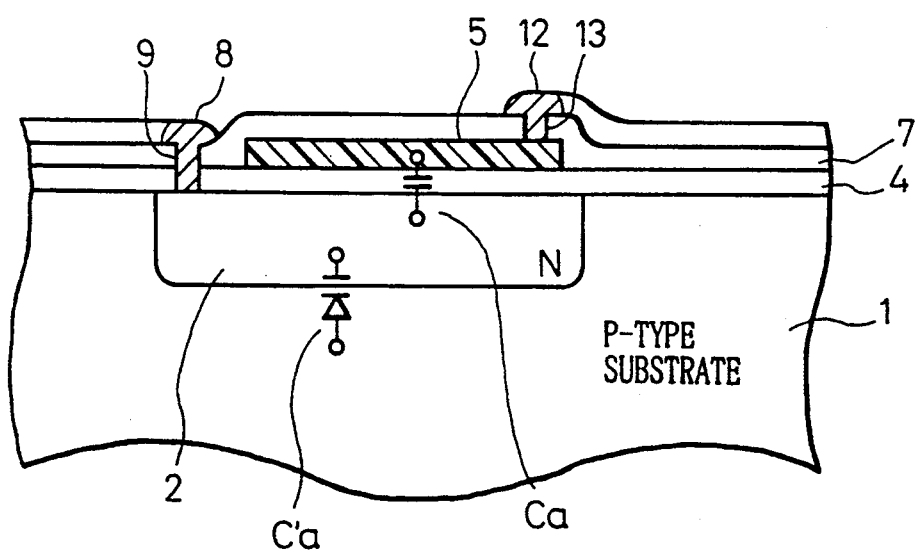
FIG. 2 is a cross sectional view of FIG. 1.

Application of the present invention to a MOS capacitor will be described below as a first embodiment of the present invention. FIG. 1 is a plan view showing the layout of the MOS capacitor with a dielectric film and an insulating film omitted. FIG. 2 is a view showing a cross-section along the line 2—2 of FIG. 1 and FIG. 3 is a view showing the equivalent circuit of the MOS capacitor.

In the drawings of FIGS. 1 and 2, reference 1 is a P-type substrate and references 2 and 3 are two N-type films which are formed in the P-type substrate. It is to be noted that the description which will be given here is related to an example where an area in which only one semiconductor capacitor element is formed, according to the prior art, is divided into two parts to thereby obtain two semiconductor capacitor elements. Reference 4 is a dielectric film such as an oxide film or a nitride film formed on a surface of the P-type substrate 1, references 5 and 6 are polysilicon films which are formed on the dielectric film 4 in an opposed relationship to the N-type films 2 and 3, and reference 7 is an insulating film which is formed by an oxide film covering both the dielectric film 4 and the polysilicon films 5 and 6. Reference 8 is aluminum wiring which is connected with the N-type film 2 through a contact hole 9 which is formed in the dielectric film 4 and the insulating film 7. The aluminum wiring 8 is also connected with the polysilicon layer 6 through a contact hole 10 which is formed in the insulating film 7. Reference 12 is aluminum wiring which is connected to the other polysilicon film 5 through a contact hole 13 which is formed in the insulating film 7. The aluminum wiring 12 is also connected to the N-type film 3 through a contact hole 14 which is formed in the dielectric film 4 and the insulating film 7.

In such a structure, as shown in FIG. 2, a regular capacitance Ca is formed between the N-type film 2 and the polysilicon film 5 which are disposed with the dielectric film 4 interposed therebetween. At the same time, a parasitic capacitance Ca' is formed at a junction surface at which the P-type substrate 1 and the N-type film 2 abut each other. Although not illustrated in FIG. 2, another regular capacitance Cb is similarly formed between the N-type film 3 and the polysilicon film 6 which are disposed with the dielectric film 4 interposed therebetween and another parasitic capacitance Cb' is formed at a junction surface between the P-type substrate 1 and the N-type film 3.

Figure 3:
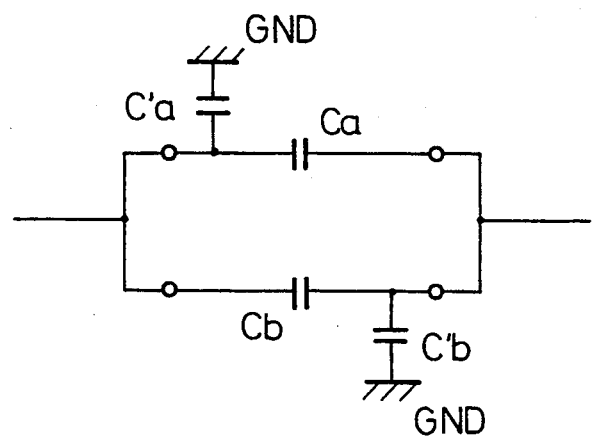
FIG. 3 is a circuit diagram showing the equivalent circuit of FIG. 1.

As can be seen in FIG. 3, which shows the equivalent circuit of the semiconductor capacitor element, the two regular capacitances Ca and Cb are connected in parallel to each other between terminals while the two parasitic capacitances Ca' and Cb' are each connected to the relevant terminal separately from each other.

The divided semiconductor capacitor elements, being formed by dividing the area in which only one semiconductor capacitor element is customarily formed into two parts, each have an area which is ½, and a capacitance which is ½, of the conventional capacitor. However, since the two semiconductor capacitor elements are connected with each other in parallel, the total capacitance of the regular capacitances Ca and Cb is equal to the conventional capacitance. In addition, the parasitic capacitances Ca' and Cb' each have a capacitance which is half the conventional parasitic capacitance The parasitic capacitances Ca' and Cb' each reduced ½, are connected, separately from each other, to different terminals. Hence, the parasitic capacitances formed at the two terminals are equal to each other.

Figure 4:
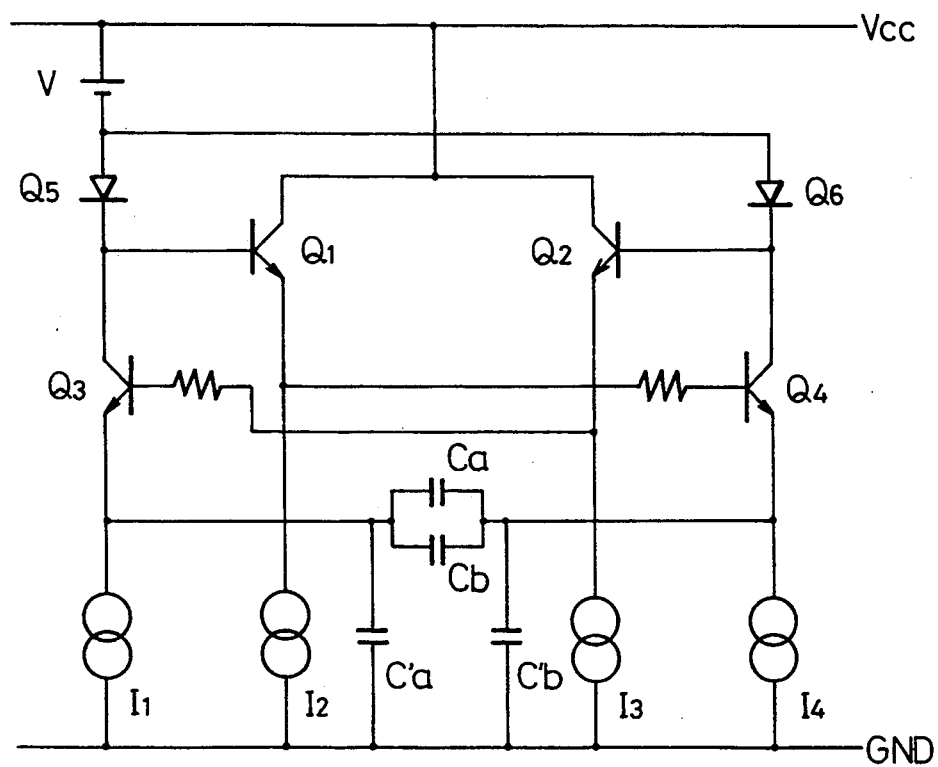
FIG. 4 is a circuit diagram of an oscillator which employs the semiconductor capacitor element of the first embodiment shown in FIG. 1.

With reference to FIG. 4, a description will be given of an example where the semiconductor capacitor element as above is used in a voltage-controlled oscillator (VCO).

In FIG. 4, the references Q1, Q2, Q3, and Q4 denote transistors, the references Q5 and Q6 denote diodes, the reference V denotes a source of voltage, the references I1, I2, I3 and I4 denote sources of current, the reference Vcc denotes a power supply, and the reference GND denotes a reference level (ground). In this embodiment, the regular capacitances Ca and Cb are connected in parallel between emitters of the transistors Q3 and Q4. On the other hand, the parasitic capacitance Ca' is connected between the transistor Q3 and GND while the parasitic capacitance Cb' is connected between the transistor Q4 and GND.

Hence, in this embodiment, the regular capacitance and the parasitic capacitance acting upon the transistor Q3 are equal to those acting upon the transistor Q4. As a result, the responses of the transistors Q3 and Q4 become equal to each other, which in turn allows stable oscillation. Moreover, since the parasitic capacitances respectively acting upon the transistors Q3 and Q4 are each a half that of the conventional parasitic capacitance, the burden of improving the driving abilities of the transistors Q3 and Q4 is eased.

Besides the example as above where the present invention is applied to an oscillator, similar effects are achievable where the semiconductor capacitor element according to the first embodiment is used in a circuit such as a mono-stable multivibrator in which a capacitance is connected between emitters of a pair of transistors.

Different from the first embodiment heretofore described, where the area in which only one semiconductor capacitor element is customarily formed is divided into two parts so that two semiconductor capacitor elements are obtained and which are connected to each other in parallel and hence which have the same capacitance as that of the conventional semiconductor capacitor element, the two semiconductor capacitor elements formed by dividing may be connected in series to each other in order to reduce the capacitances of the semiconductor capacitor elements. An example where a semiconductor capacitor element is formed by such series-connected semiconductor capacitor elements will be described, in the following, as a second embodiment of the present invention.

Figure 5:
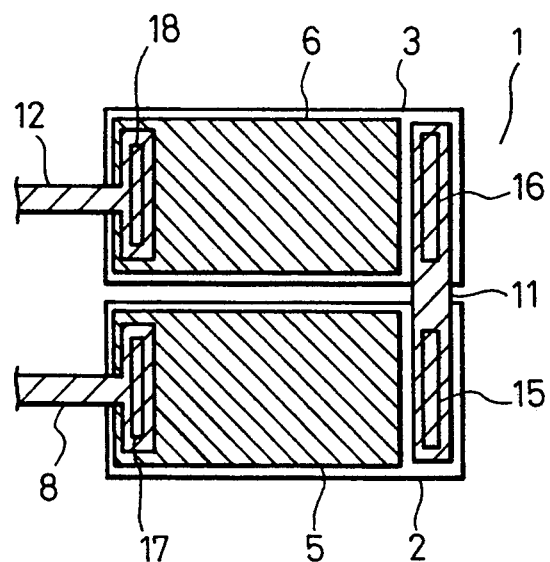
FIG. 5 is a plan view showing the layout of the semiconductor capacitor element of the second embodiment of the present invention.
Figure 6:
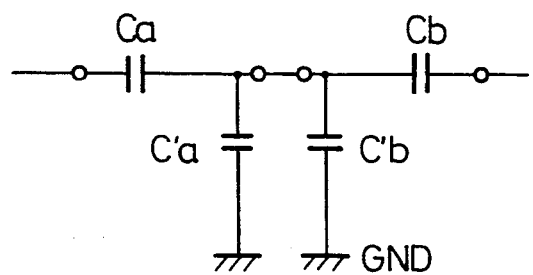
FIG. 6 is a circuit diagram showing the equivalent circuit of FIG. 5.

FIG. 5 is a plan view showing the layout of the semiconductor capacitor element, with a dielectric film and an insulating film omitted, and FIG. 6 is a circuit diagram showing an equivalent circuit. A cross section of the semiconductor capacitor element of the second embodiment is almost the same as that of the semiconductor capacitor element of the first embodiment shown in FIG. 2.

In the second embodiment, the N-type films 2 and 3 are divided into two parts in the P-type substrate 1, and the regular capacitances Ca and Cb are respectively formed between the N-type film 2 and the polysilicon film 5, which are disposed with the dielectric film 4 interposed therebetween, and between the N-type film 3 and the polysilicon film 6, which are disposed with the dielectric film 4 interposed therebetween. At the same time, the parasitic capacitances Ca' and Cb' are respectively formed at a junction surface between the P-type substrate 1 and at the N-type film 2 and a junction surface between the P-type substrate 1 and the N-type film 3.

The N-type films 2 and 3 of these two semiconductor capacitor elements are connected to each other by aluminum wiring 11 through contact holes 15 and 16 which are formed in the dielectric film 4 and the insulating film 7 while the polysilicon films 5 and 6 are connected to other aluminum wirings 8 and 12 through contact holes 17 and 18 which are formed in the insulating film 7. Hence, as shown in the equivalent circuit of FIG. 6, the two regular capacitances Ca and Cb are connected in series to each other. On the other hand, the parasitic capacitances Ca' and Cb' are connected to intermediate points between the regular capacitances Ca and Cb which are connected in series to each other.

In such a semiconductor capacitor element, since the divided semiconductor capacitor elements, each reduced by ½, are connected in series to each other, the total capacitance of the regular capacitances Ca and Cb is reduced to ¼. As to the parasitic capacitances, on the other hand, since the parasitic capacitances are connected to the intermediate points between the regular capacitances, the parasitic capacitances acting upon the terminals of the semiconductor capacitor elements are equal to each other. In addition, the values of the parasitic capacitances Ca' and Cb' of this embodiment, although equal to the conventional parasitic capacitance, are reduced at each external terminal since they are connected respectively through the regular capacitances Ca and Cb.

Figure 7:
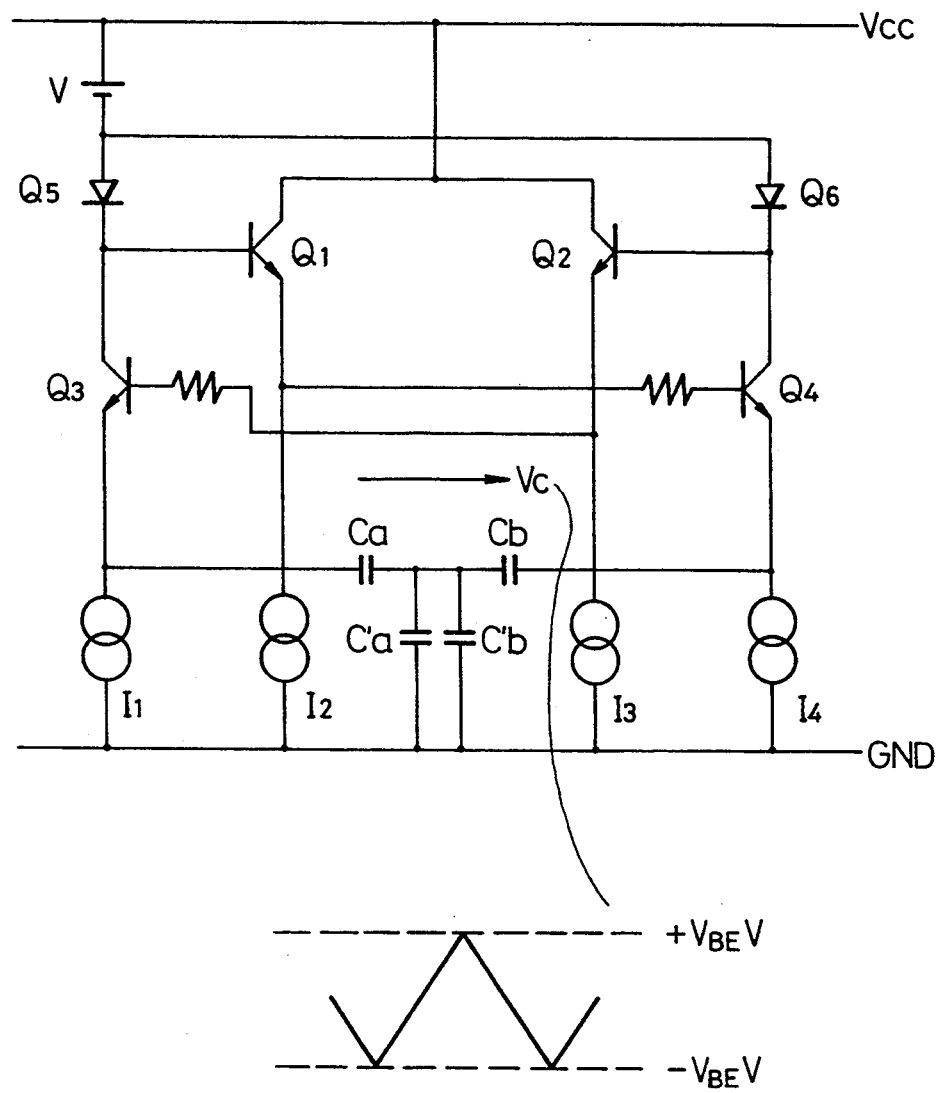
FIG. 7A is a circuit diagram of an oscillator which employs the semiconductor capacitor element of the first embodiment shown in FIG. 5
FIG. 7B is a plot of the range of variation in the voltage Vc.

FIG. 7A illustrates an example where the semiconductor capacitor element of the second embodiment is used in a voltage-controlled oscillator. The regular capacitances Ca and Cb are connected in series between emitters of the transistors Q3 and Q4. On the other hand, the parasitic capacitances Ca' and Cb' are connected between respective intermediate points, between the regular capacitances Ca and Cb, and GND.

In this circuit, while the oscillator is operating, the voltage Vc which is applied to the regular capacitances Ca and Cb varies in the range from +0.7 v to −0.7 v as shown in FIG. 7B. Potentials at the intermediate points between the regular capacitances Ca and Cb to which the parasitic capacitances Ca' and Cb' are connected stay at 0 v during operation of the oscillator. Hence, the voltage which is applied to the parasitic capacitances Ca' and Cb' is always 0 v, with a result that the parasitic capacitances exert no influence in the circuit.

Besides the example as above where the present invention is applied to an oscillator, similar effects are achievable where the semiconductor capacitor element according to the second embodiment is used in a circuit such as a mono-stable multivibrator in which a capacitance is connected between emitters of a pair of transistors.

In relation to the first and the second embodiments of the present invention, for the sake of clear comparison between the semiconductor capacitor element of the present invention and the conventional semiconductor capacitor element, which is formed as a single semiconductor capacitor element, the foregoing has described that the area, in which only one semiconductor capacitor element is customarily formed, is divided into two parts so that the two semiconductor capacitor elements can be connected in parallel or in series, whereby a composite semiconductor capacitor element is obtained. However, the divided semiconductor capacitor elements according to the present invention may not be formed within the area in which only one semiconductor capacitor element is customarily formed. Rather, depending on a capacitance that is required, the areas of the divided semiconductor capacitor elements may be determined as desired.

In addition, although the two semiconductor capacitor elements are connected in parallel to each other or in series to each other in the embodiments heretofore described, in the present invention, a larger number of such semiconductor capacitor elements may be connected in parallel to each other or in series to each other.

Figure 8:
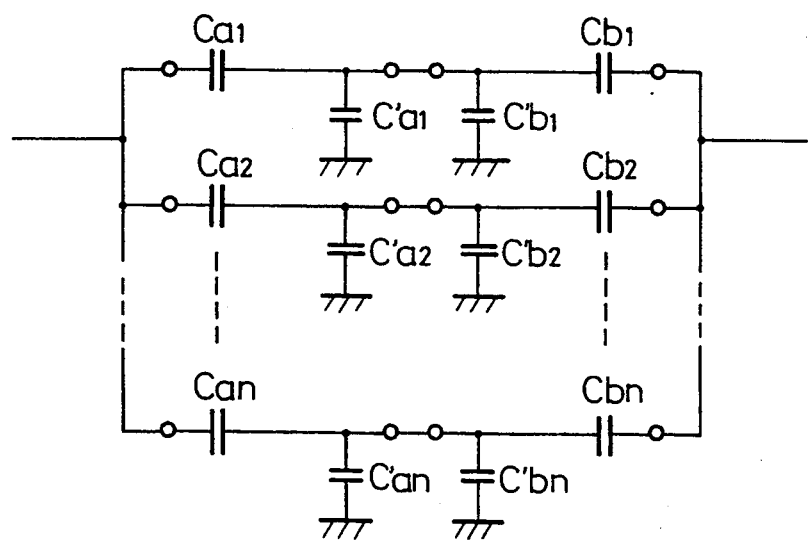
FIG. 8 is a circuit diagram of an embodiment wherein a plurality of semiconductor capacitor elements, such as that shown in FIG. 5, are connected in parallel to each other.
Figure 9:
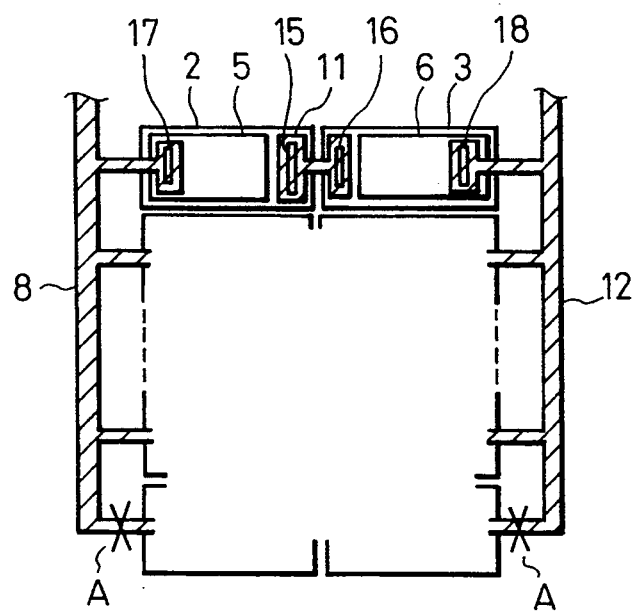
FIG. 9 is a plan view of the layout of FIG. 8.

An embodiment where n semiconductor capacitor element, such as those described in the second embodiment, are connected in parallel to each other will be now described with reference to FIG. 8 which shows a circuit diagram and FIG. 9 which shows a plan layout view.

In this embodiment, an optional number of semiconductor capacitor elements, i.e., 2n semiconductor capacitor elements are formed. Of the 2n semiconductor capacitor elements, two semiconductor capacitor elements are connected to each other by the aluminum wiring 11 so that regular series-connected capacitance pairs Ca1 and Cb1, Ca2 and Cb2, . . . Can and Cbn are formed. For the reason described in relation to the second embodiment, parasitic capacitances C'a1 and C'b1, C'a2 and C'b2, . . . C'an and C'bn are formed at intermediate points between the regular capacitances.

The plurality of series-connected semiconductor capacitor elements is connected in parallel by the aluminum wirings 8 and 12. According to this embodiment, by selecting the number of the semiconductor capacitor elements which are to be connected by the aluminum wirings 8 and 12 at the design stage, the capacitances of the semiconductor capacitor elements can be adjusted. Further, even at a manufacturing stage, as shown in FIG. 9, after the wiring process, by cutting the aluminum wirings 8 and 12 at appropriate points, for example, at the points A, it is possible to adjust the capacitances of the semiconductor capacitor elements.

Figure 10:
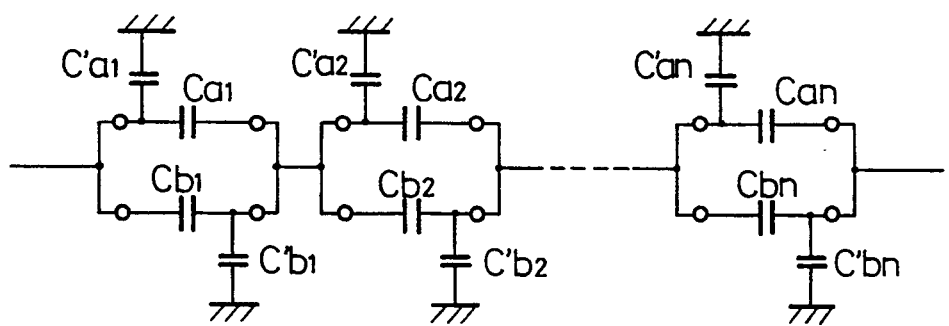
FIG. 10 is a circuit diagram of a embodiment wherein a plurality of semiconductor capacitor elements, such as that shown in FIG. 3, are connected in series to each other.

Next, an embodiment where n semiconductor capacitor elements such as those described in the first embodiment are connected in series will be now described with reference to FIG. 10 which shows a circuit diagram.

In this embodiment, an optional number of semiconductor capacitor elements, i.e., 2n semiconductor capacitor elements are formed. Of the 2n semiconductor capacitor elements, two semiconductor capacitor elements are connected in parallel to each other as described in the first embodiment. Regular capacitance pairs Ca1 and Cb1, Ca2 and Cb2, . . . Can and Cbn are all connected in series to each other. Parasitic capacitances C'a1, C'b1, . . . C'an and C'bn are formed separately from each other at associated terminals of the parallel-connected regular capacitance pairs Ca1 and Cb1 . . . Can and Cbn. In this embodiment as well, the parasitic capacitances at the respective terminals are equal to each other.

Still further, according to the present invention, the semiconductor capacitor elements of the first and the second embodiments may be combined with each other. Such an embodiment will be described with reference to FIGS. 11 and 12 each showing a circuit diagram.

Figure 11:
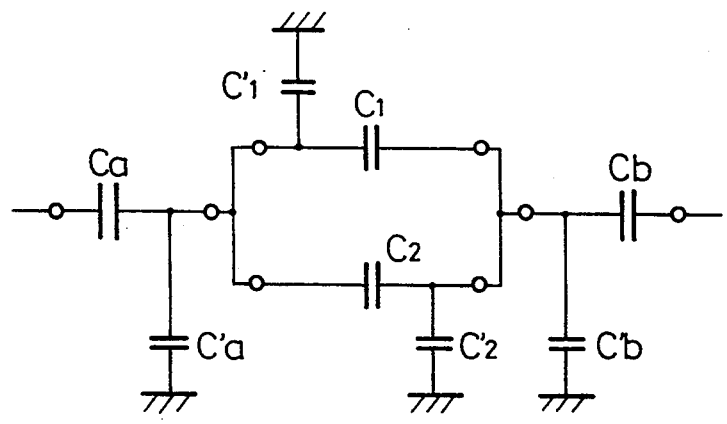
FIG. 11 is a circuit diagram of an embodiment wherein the semiconductor capacitor elements of FIGS. 3 and 5 are combined with each other.

In FIG. 11, there is illustrated a structure in which the two series-connected semiconductor capacitor elements of the second embodiment are separated from each other at the series-connection point and the pair of the parallel-connected semiconductor capacitor elements of the first embodiment is inserted therebetween. In this embodiment, regular capacitances C1 and C2 are connected in parallel to each other and the parallel-connected regular capacitances C1 and C2 are connected to intermediate points between regular capacitances Ca and Cb. Due to such connection, parasitic capacitances C'a, C'b, C'1 and C'2 are formed evenly between the parallel-connected portion and the series-connected portion so that the parasitic capacitances at the respective terminals are equal to each other.

Figure 12:
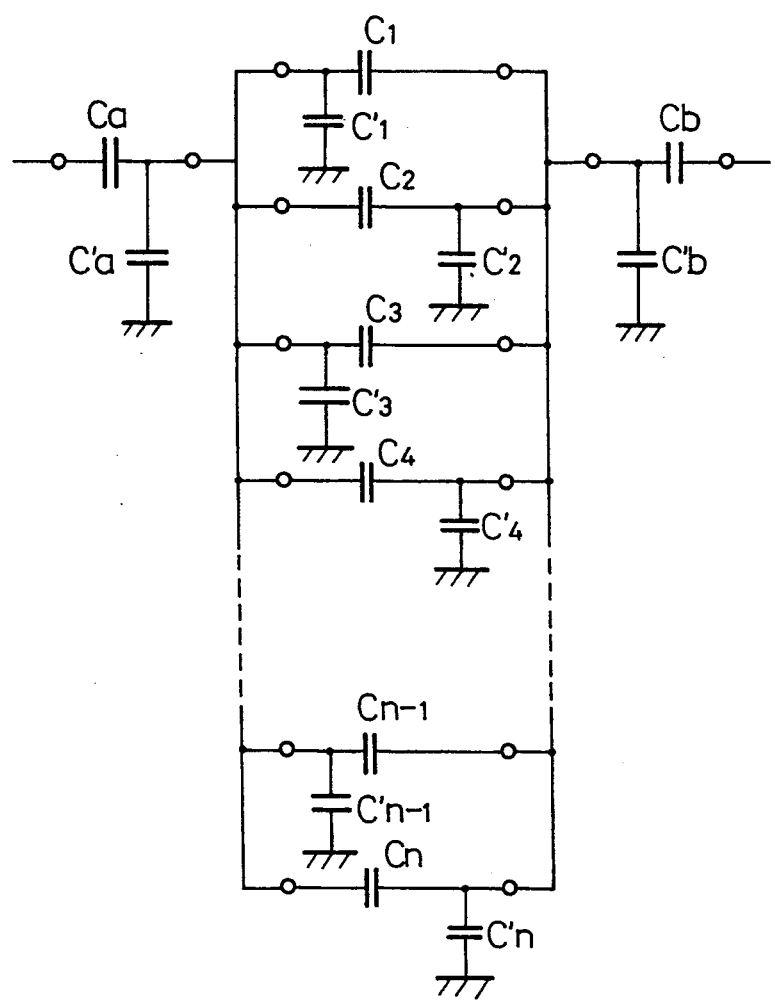
FIG. 12 is a circuit diagram of a modification of the circuit which is shown in FIG. 11.

The structure shown in FIG. 12 includes a plurality of parallel-connected semiconductor capacitor element pairs, such as those shown in FIG. 11, which are inserted in the center. The plurality of parallel-connected semiconductor capacitor element pairs are connected in parallel to each other. In this embodiment, the plurality of parallel-connected regular capacitance pairs C1 and C2, C3 and C4, . . . Cn-1 and Cn, such as those described in the first embodiment, are all connected in parallel to each other. This assembly, of the regular capacitance pairs which are connected in parallel to each other, is connected between the two regular capacitances Ca and Cb. In this embodiment as well, parasitic capacitances C'a, C'b, C'1, C'2 . . . C'n-1 and C'n are created evenly between the parallel-connected portion, and the series-connected portion so that the parasitic capacitances are at the respective terminals and are equal to each other. It is to be noted that in the structure shown in FIG. 12, to obtain equal parasitic capacitances at the terminals which are relevant to each other, the number n must be an even number.

As described above, in the present invention, two semiconductor capacitor elements are created. Among the two semiconductor capacitor elements, terminals which have the parasitic capacitances are connected to terminals which do not have the parasitic capacitance so that the two semiconductor capacitor elements are connected in parallel to each other, thereby forming a semiconductor capacitor element. Alternatively, to form the semiconductor capacitor element, two semiconductor capacitor elements are connected in series to each other by connecting terminals having parasitic capacitances to each other.

Adopting these structures, the present invention makes the parasitic capacitances at the respective terminals equal to each other. As compared with the conventional structure wherein a greater number of parasitic capacitances are connected to one terminal than to the other terminal, the parasitic capacitances are also reduced at each terminal.

Hence, the composite semiconductor capacitor element according to the present invention, when applied to a circuit in which adverse effects are created by parasitic capacitances, reduces the adverse effects of the parasitic capacitances. In particular, when the semiconductor capacitor element according to the present invention is applied to a circuit which has a capacitance which is connected to emitters of a pair of transistors which are differentially connected, for example, an oscillator, a mono-stable multivibrator, etc., small parasitic capacitances act evenly upon both transistors of the transistor pair. Hence, it is possible to operate the transistors within their driving abilities and at the same speeds.

In addition, by using a plurality of divided semiconductor capacitor elements and combining parallel-connected divided semiconductor capacitor elements and series-connected divided semiconductor capacitor elements in a proper manner, it is possible to adjust the capacitances of the semiconductor capacitor elements at both the design stage and the fabrication stage.

While the invention has been described in relation to a MOS capacitor, application of the present invention is not limited to a MOS capacitor. Rather, the present invention is applicable to any kind of semiconductor capacitor element in which, in addition to a regular capacitance which is created between a pair of terminals of the semiconductor capacitor element, a parasitic capacitance is formed at one of the pair of the terminals. For instance, among semiconductor capacitor elements except for a MOS capacitance, is a junction capacitance such as that shown in FIG. 16 and described as a prior art.

As to the layout of the semiconductor capacitor element and how the divided semiconductor capacitor elements are connected to each other, numerous other modifications and variations can be devised without departing from the scope of the invention.

It is claimed:

1. A semiconductor capacitor element comprising:
   a first semiconductor capacitor element and a second semiconductor capacitor element, each of said first and second semiconductor capacitor elements comprising a first terminal, a second terminal, a regular capacitance formed between the first and second terminals and a parasitic capacitance formed at the second terminal, and
   said first terminal of said first semiconductor capacitor element being connected to said second terminal of said second semiconductor capacitor element and said first terminal of said second semiconductor capacitor element being connected to said second terminal of said first semiconductor capacitor element, said first and second semiconductor capacitor elements thereby being connected in parallel.

2. A semiconductor capacitor element according to claim 1, each of said first and second semiconductor capacitor elements comprising:
   a semiconductor substrate having a first conductivity type;
   a lower electrode region defined the surface of said semiconductor substrate and having an opposite conductivity type, relatively to said semiconductor substrate, and connected to said second terminal;
   a dielectric film formed on said lower electrode region; and
   an upper electrode formed on said dielectric film and connected to said first terminal.

3. A semiconductor capacitor element according to claim 1, further comprising:
   a plurality of said parallel-connected capacitor elements connected in parallel.

4. A semiconductor capacitor element according to claim 1, further comprising:
   a plurality of said parallel-connected capacitor elements connected in series.

5. A semiconductor circuit comprising a pair of transistors and a semiconductor capacitor element connected between the respective emitters of the pair of transistors, said semiconductor capacitor element comprising:
   a first semiconductor capacitor element having a first terminal, a second terminal, a regular capacitance formed between the first and second terminals and a parasitic capacitance formed at the second terminal;
   a second semiconductor capacitor element having a first terminal, a second terminal, a regular capacitance formed between the first and second terminals and a parasitic capacitance formed at the second terminal; and
   said first terminal of said first semiconductor capacitor element being connected to said second terminal of said second semiconductor capacitor element and said first terminal of said second semiconductor capacitor element being connected to said second terminal of said first semiconductor capacitor element, said first semiconductor capacitor element and said second semiconductor capacitor element thereby being connected in parallel.

6. An oscillator circuit comprising a pair of transistors and a semiconductor capacitor element connected between the respective emitters of the pair of transistors, said semiconductor capacitor element comprising:
   a first semiconductor capacitor element having a first terminal, a second terminal, a regular capacitance formed between the first and second terminals and a parasitic capacitance formed at the second terminal:
   a second semiconductor capacitor element having a first terminal, a second terminal, a regular capacitance formed between the first and second terminals and a parasitic capacitance formed at the second terminal; and said first terminal of said first semiconductor capacitor element being connected to said second terminal of said second semiconductor capacitor element, and said first terminal of said second semiconductor capacitor element being connected to said second terminal of said first semiconductor capacitor element, said first semiconductor capacitor element and said second semiconductor capacitor element thereby being connected in parallel.

7. A mono-stable multivibrator circuit comprising a pair of transistors and a semiconductor capacitor element connected between the respective emitters of the pair of transistors, said semiconductor capacitor element comprising:

a first semiconductor capacitor element having a first terminal, a second terminal, a regular capacitance formed between the first and second terminals and a parasitic capacitance formed at the second terminal;

a second semiconductor capacitor element having a first terminal, a second terminal, a regular capacitance formed between the first and second terminals and a parasitic capacitance formed at the second terminal; and said first terminal of said first semiconductor capacitor element being connected to said second terminal of said second semiconductor capacitor element and said first terminal of said second semiconductor capacitor element being connected to said second terminal of said first semiconductor capacitor element, said first semiconductor capacitor element and said second semiconductor capacitor element thereby being connected in parallel.

8. A semiconductor capacitor element comprising:

a first semiconductor capacitor element and a second semiconductor capacitor element, each of said first and second semiconductor capacitor elements comprising a first terminal, a second terminal, a regular capacitance formed between the first and second terminals and a parasitic capacitance formed at the second terminal; and said second terminal of said first semiconductor capacitor element being connected to said second terminal of said second semiconductor capacitor element, said first and second semiconductor capacitor element thereby being connected in series.

9. A semiconductor capacitor element according to claim 8, each of said first and second semiconductor capacitor elements comprising:

a semiconductor substrate having a first conductivity type;

a lower electrode region defined in the surface of said semiconductor substrate and having an opposite conductivity type to said semiconductor substrate and connected to said second terminal;

a dielectric film formed on said lower electrode region; and an upper electrode formed on said dielectric film connected to said first terminal.

10. A semiconductor capacitor element according to claim 8, further comprising:

a plurality of series-connected capacitor elements are connected in parallel.

11. A semiconductor capacitor element according to claim 8 further comprising:

a plurality of series-connected capacitor elements connected in series.

12. A semiconductor circuit comprising a pair of transistors and a semiconductor capacitor element connected between the respective emitters of the pair of transistors, said semiconductor capacitor element comprising:

a first semiconductor capacitor element having a first terminal, a second terminal, a regular capacitance formed between the first and second terminals and a parasitic capacitance formed at the second terminal;

a second semiconductor capacitor element having a first terminal, a second terminal, a regular capacitance formed between the first and second terminals and a parasitic capacitance formed at the second terminal; and said second terminal of said first semiconductor capacitor element being connected to said second terminal of said second semiconductor capacitor element, said first semiconductor capacitor element and said second semiconductor capacitor element thereby being connected in series.

13. An oscillator circuit comprising a pair of transistors and a semiconductor capacitor element connected between the respective emitters of the pair of transistors, said semiconductor capacitor element comprising:

a first semiconductor capacitor element having a first terminal, a second terminal, a regular capacitance formed between the first and second terminals and a parasitic capacitance formed at the second terminal;

a second semiconductor capacitor element having a first terminal, a second terminal, a regular capacitance formed between the first and second terminals and a parasitic capacitance formed at the second terminal; and said second terminal of said first semiconductor capacitor element being connected to said second terminal of said second semiconductor capacitor element, said first semiconductor capacitor element and said second semiconductor capacitor element thereby being connected in series.

14. A mono-stable multivibrator circuit comprising a pair of transistors and a semiconductor capacitor element connected between the respective emitters of the pair of transistors, said semiconductor capacitor element comprising:

a first semiconductor capacitor element having a first terminal, a second terminal, a regular capacitance formed between the first and second terminals and a parasitic capacitance formed at the second terminal;

a second semiconductor capacitor element having a first terminal, a second terminal, a regular capacitance formed between the first and second terminals and a parasitic capacitance formed at the second terminal; and said second terminal of said first semiconductor capacitor element being connected to said second terminal of said second semiconductor capacitor element, said first semiconductor capacitor element and said second semiconductor capacitor element thereby being connected in series.

15. A semiconductor capacitor element comprising:

a first semiconductor capacitor element, a second semiconductor capacitor element, a third semiconductor capacitor element and a fourth semiconductor capacitor element, each of said semiconductor capacitor elements further comprising a first terminal, a second terminal, a regular capacitance formed between the first and second terminals and a parasitic capacitance formed at the second terminal;

said first terminal of said first semiconductor capacitor element being connected to said second terminal of said second semiconductor capacitor element and said first terminal of said second semiconductor capacitor element being connected to said second terminal of said first semiconductor capacitor element, said first and said second semiconductor capacitor elements thereby being connected in parallel; and said second terminal of said third semiconductor capacitor element being connected to said second terminal of said first semiconductor capacitor element in series and said second terminal of said fourth semiconductor capacitor element being connected to said first terminal of said first semiconductor capacitor element in series.

16. A semiconductor capacitor element according to claim 15, each of said first, second, third, and fourth semiconductor capacitor elements comprising:

a semiconductor substrate having a first conductivity type;

a lower electrode region defined on the surface of said semiconductor substrate and having an opposite conductivity type, relatively to said semiconductor substrate, and connected to said second terminal;

a dielectric film formed on said lower electrode region; and an upper electrode formed on said dielectric film and connected to said first terminal.

17. A semiconductor capacitor according to claim 15, further comprising:

a plurality of parallel-connected capacitor elements connected in parallel.

18. A semiconductor circuit comprising a pair of transistors and a semiconductor capacitor element connected between the emitters of the pair of transistors, said semiconductor capacitor element comprising:

a first semiconductor capacitor element, a second semiconductor capacitor element, a third semiconductor capacitor element and a fourth semiconductor capacitor element, each of said semiconductor capacitor elements having a first terminal, a second terminal, a regular capacitance formed between the first and second terminals and a parasitic capacitance formed at the second terminal;

said first terminal of said first semiconductor capacitor element being connected to said second terminal of said second semiconductor capacitor element and said first terminal of said second semiconductor capacitor element being connected to said second terminal of said first semiconductor capacitor element, said first and said second semiconductor capacitor elements thereby being connected in parallel; and said second terminal of said third semiconductor capacitor element being connected to said second terminal of said first semiconductor capacitor element in series and said second terminal of said fourth semiconductor capacitor element being connected to said first terminal of said first semiconductor capacitor element in series.

19. An oscillator circuit comprising a pair of transistors and a semiconductor capacitor element connected between the emitters of the pair of transistors, said semiconductor capacitor element comprising:

a first semiconductor capacitor element, a second semiconductor capacitor elements, a third semiconductor capacitor element and a fourth semiconductor capacitor element, each of said semiconductor capacitor elements having a first terminal, a second terminal, a regular capacitance formed between the first and second terminals and a parasitic capacitance formed at the second terminal;

said first terminal of said first semiconductor capacitor element being connected to said second terminal of said second semiconductor capacitor element and said first terminal of said second semiconductor capacitor element being connected to said second terminal of said first semiconductor capacitor element, said first and said second semiconductor capacitor elements thereby being connected in parallel; and said second terminal of said third semiconductor capacitor element being connected to said second terminal of said first semiconductor capacitor element in series and said second terminal of said fourth semiconductor capacitor element being connected to said first terminal of said first semiconductor capacitor element in series.

20. A mono-stable multivibrator circuit comprising a pair of transistors and a semiconductor capacitor element connected between the emitters of the pair of transistors, said semiconductor capacitor element comprising:

a first semiconductor capacitor element, a second semiconductor capacitor element, a third semiconductor capacitor element and a fourth semiconductor capacitor element, each of said semiconductor capacitor elements having a first terminal, a second terminal, a regular capacitance formed between the first and second terminals and a parasitic capacitance formed at the second terminal;

said first terminal of said first semiconductor capacitor element being connected to said second terminal of said second semiconductor capacitor element and said first terminal of said second semiconductor capacitor element being connected to said second terminal of said first semiconductor capacitor element, said first and said second semiconductor capacitor elements thereby being connected in parallel; and said second terminal of said third semiconductor capacitor element being connected to said second terminal of said first semiconductor capacitor element in series and said second terminal of said fourth semiconductor capacitor element being connected to said first terminal of said first semiconductor capacitor element in series.

* * * * *